(12) United States Patent
Bergman et al.

(10) Patent No.: US 9,521,754 B1
(45) Date of Patent: Dec. 13, 2016

(54) EMBEDDED COMPONENTS IN A SUBSTRATE

(71) Applicant: Flextronics AP, LLC, Broomfield, CO (US)

(72) Inventors: Mark Bergman, Redwood City, CA (US); Shurui Shang, San Jose, CA (US); Joan K. Vrtis, Mesa, AZ (US)

(73) Assignee: Multek Technologies Limited, San Jose, CA (US)

( * ) Notice: Subject to any disclaimer, the term of this patent is extended or adjusted under 35 U.S.C. 154(b) by 0 days.

(21) Appl. No.: 14/463,361

(22) Filed: Aug. 19, 2014

Related U.S. Application Data (60) Provisional application No. 61/867,360, filed on Aug. 19, 2013, provisional application No. 61/931,355, filed on Jan. 24, 2014.

(51) Int. Cl.
| | |
|---|---|
| H05K 1/18 | (2006.01) |
| H05K 3/10 | (2006.01) |
| H05K 3/30 | (2006.01) |
| H05K 1/09 | (2006.01) |
| H05K 1/02 | (2006.01) |

(52) U.S. Cl.
CPC ............ *H05K 1/185* (2013.01); *H05K 1/0271* (2013.01); *H05K 1/09* (2013.01); *H05K 1/183* (2013.01); *H05K 3/103* (2013.01); *H05K 3/30* (2013.01); *H05K 1/18* (2013.01)

(58) Field of Classification Search
CPC ........ H05K 1/185; H05K 1/0271; H05K 3/30; H05K 1/09; H05K 3/103; H05K 1/18; H05K 1/182; H05K 1/183; H05K 1/186; H05K 1/188; H05K 3/321; H05K 3/323

USPC .......... 174/250–268; 361/760–766, 792–795
See application file for complete search history.

(56) References Cited

U.S. PATENT DOCUMENTS

| | | |
|---|---|---|
| 4,069,497 A | 1/1978 | Steidlitz |
| 4,712,160 A | 12/1987 | Sato et al. |
| 4,881,885 A | 11/1989 | Kovac et al. |
| 4,899,256 A | 2/1990 | Sway-Tin |

(Continued)

OTHER PUBLICATIONS

Understanding the Influence of Copper Nanoparticles Thermal Characteristics and Microstructural Development of a Tin-Silver Solder, Revised, Oct. 10, 2006, by D.C. Lin, T.S. Srivatsan, G-X Wang, and R. Kovacevic, pp. 647-653.

(Continued)

*Primary Examiner* — Ishwarbhai B Patel
(74) *Attorney, Agent, or Firm* — Haverstock & Owens LLP

(57) ABSTRACT

An embedded component is formed in a PCB stack by applying an adhesive layer across an entire surface of a copper layer and selectively positioning the component on a portion of the adhesive layer. A B stage pre-preg layer having a component cut-out is added onto the adhesive layer such that the component adhered to the adhesive layer fits within the component cut-out of the B stage pre-preg layer. Another copper layer is added onto the B stage pre-preg layer and the PCB stack is laminated. Since B stage pre-preg is not fully cured, a gap between the component and a side wall of the component cut-out is filled by flow of the surrounding B stage pre-preg during the lamination step. One or more additional pre-preg and copper layers are added to the PCB stack with corresponding interconnects formed and coupled to the contact pads on the component.

6 Claims, 6 Drawing Sheets

(56) References Cited

U.S. PATENT DOCUMENTS

| | | |
|---|---|---|
| 4,954,453 A | 9/1990 | Venutolo |
| 5,101,322 A | 3/1992 | Ghaem et al. |
| 5,235,491 A | 8/1993 | Weiss |
| 5,272,599 A | 12/1993 | Koenen |
| 5,295,044 A | 3/1994 | Araki et al. |
| 5,365,403 A | 11/1994 | Vinciarelli et al. |
| 5,536,677 A | 7/1996 | Hutbacher |
| 5,838,554 A | 11/1998 | Lanni |
| 5,872,051 A | 2/1999 | Fallon et al. |
| 5,873,512 A | 2/1999 | Bielick et al. |
| 5,920,458 A | 7/1999 | Azar |
| 5,933,324 A | 8/1999 | Barrett |
| 5,974,576 A | 10/1999 | Zhu |
| 6,081,037 A | 6/2000 | Lee |
| 6,083,848 A | 7/2000 | Sugasawara et al. |
| 6,163,014 A | 12/2000 | Bergeron et al. |
| 6,189,771 B1 | 2/2001 | Maeda et al. |
| 6,198,367 B1 | 3/2001 | Matsunaga et al. |
| 6,201,930 B1 | 3/2001 | Close et al. |
| 6,202,181 B1 | 3/2001 | Ferguson et al. |
| 6,243,269 B1 | 6/2001 | Dibene, II et al. |
| 6,245,595 B1 | 6/2001 | Nguyen |
| 6,272,015 B1 | 8/2001 | Mangtani |
| 6,282,092 B1 | 8/2001 | Okamoto et al. |
| 6,299,053 B1 | 10/2001 | Kamath et al. |
| 6,311,139 B1 | 10/2001 | Kuroda et al. |
| 6,369,328 B1 | 4/2002 | Munakata |
| 6,400,573 B1 * | 6/2002 | Mowatt ............... H01L 23/5383 174/252 |
| 6,549,409 B1 | 4/2003 | Saxelby et al. |
| 6,560,736 B2 | 5/2003 | Ferguson et al. |
| 6,627,993 B1 | 9/2003 | Shen |
| 6,775,162 B2 | 8/2004 | Mihai et al. |
| 6,795,315 B1 | 9/2004 | Wu et al. |
| 7,036,059 B1 | 4/2006 | Carmichael et al. |
| 7,084,356 B2 | 8/2006 | English et al. |
| 7,208,833 B2 | 4/2007 | Nobori et al. |
| 7,225,368 B2 | 5/2007 | Lancaster |
| 7,324,924 B2 | 1/2008 | Barajas et al. |
| 7,676,775 B2 | 3/2010 | Chen et al. |
| 7,703,197 B2 | 4/2010 | Moltion |
| 7,836,583 B2 | 11/2010 | Amurao et al. |
| 7,935,893 B2 * | 5/2011 | Tanaka ................... H01L 24/18 174/258 |
| 8,330,051 B2 | 12/2012 | Huang |
| 8,707,221 B2 | 4/2014 | Durkan |
| 2001/0003427 A1 | 6/2001 | Ferguson et al. |
| 2001/0018263 A1 | 8/2001 | Ochiai et al. |
| 2001/0045297 A1 | 11/2001 | Miller et al. |
| 2002/0008963 A1 | 1/2002 | DiBene, II et al. |
| 2002/0053065 A1 | 5/2002 | Mitsutake et al. |
| 2002/0092160 A1 | 7/2002 | McCullough |
| 2004/0000425 A1 | 1/2004 | White |
| 2004/0122606 A1 | 6/2004 | Cohen et al. |
| 2004/0144527 A1 | 7/2004 | Yang et al. |
| 2005/0097481 A1 | 5/2005 | Mitsutake et al. |
| 2005/0246590 A1 | 11/2005 | Lancaster |
| 2006/0046471 A1 | 3/2006 | Kirby |
| 2006/0131360 A1 | 6/2006 | Durston et al. |
| 2006/0131440 A1 | 6/2006 | Yen |
| 2006/0196642 A1 | 9/2006 | Gharib |
| 2006/0225270 A1 | 10/2006 | Wong et al. |
| 2007/0077682 A1 | 4/2007 | Cerio, Jr. |
| 2007/0179753 A1 | 8/2007 | Barajas et al. |
| 2007/0198548 A1 | 8/2007 | Lee |
| 2007/0221404 A1 | 9/2007 | Das |
| 2007/0273011 A1 | 11/2007 | Singleton et al. |
| 2008/0004823 A1 | 1/2008 | Matsushita et al. |
| 2008/0054443 A1 * | 3/2008 | Shih ................... H01L 23/5389 257/698 |
| 2008/0173699 A1 | 7/2008 | Shoji et al. |
| 2008/0217768 A1 | 9/2008 | Miranda et al. |
| 2008/0224026 A1 | 9/2008 | Pasternak |
| 2008/0301597 A1 | 12/2008 | Chen et al. |
| 2009/0014501 A1 | 1/2009 | Nishi et al. |
| 2009/0083975 A1 | 4/2009 | Lee |
| 2009/0120924 A1 | 5/2009 | Moffatt et al. |
| 2009/0265155 A1 | 10/2009 | Yokogawa |
| 2009/0301606 A1 | 12/2009 | Ueshima |
| 2010/0000762 A1 | 1/2010 | Yang |
| 2011/0225816 A1 * | 9/2011 | Chou ................... H05K 1/185 29/829 |
| 2011/0290540 A1 * | 12/2011 | Jung ................... H01L 23/13 174/255 |
| 2011/0307752 A1 | 12/2011 | Fuji et al. |
| 2012/0024575 A1 | 2/2012 | Zhang |
| 2012/0063096 A1 | 3/2012 | Kearney |
| 2012/0192406 A1 | 8/2012 | Hafeli et al. |
| 2012/0217049 A1 * | 8/2012 | Hanai ................... H05K 1/185 174/260 |
| 2013/0209672 A1 | 8/2013 | Reinmuth |
| 2013/0216699 A1 | 8/2013 | Yamaguchi |
| 2013/0316551 A1 | 11/2013 | Day, Jr. |
| 2015/0015288 A1 | 1/2015 | Ma |

OTHER PUBLICATIONS

A Reliability Study of Nanoparticles Reinforced Composite Lead-Free Solder, Si Chen et al., Published Sep. 25, 2010, pp. 1720-1726.

Recent Development of Nano-solder Paste for Electronics Interconnect Applications, Johan Liu, Cristina Andersson, Yulai Gao and Qiije Zhai, pp. 84-93.

Non-final office action dated Aug. 11, 2016, U.S. Appl. No. 14/476,549, filed Sep. 3, 2014, Art Unit, 2847, 9 pages.

* cited by examiner

EMBEDDED COMPONENTS IN A SUBSTRATE

RELATED APPLICATIONS

This Patent Application claims priority under 35 U.S.C. 119(e) of the U.S. provisional patent application, Application No. 61/867,360, filed on Aug. 19, 2013, and entitled "EMBEDDED COMPONENTS IN A SUBSTRATE," which is also hereby incorporated by reference in its entirety. This Patent Application also claims priority under 35 U.S.C. 119(e) of the U.S. provisional patent application, Application No. 61/931,355, filed on Jan. 24, 2014, and entitled "EMBEDDED COMPONENTS," which is also hereby incorporated by reference in its entirety.

FIELD OF THE INVENTION

The present invention is generally directed to circuit boards. More specifically, the present invention is directed to embedded components in a circuit board substrate.

BACKGROUND OF THE INVENTION

A printed circuit board (PCB) mechanically supports and electrically connects electronic components using conductive traces, pads and other features etched from conductive sheets, such as copper, laminated onto a non-conductive substrate, referred to as PCB laminate or pre-preg. PCBs can be single sided (one copper layer), double sided (two copper layers) or multi-layered. Conductors on different layers are connected with plated through holes called vias. The through holes are formed after all layers of the PCB are laminated together. A drill or laser is commonly used to form each through hole. The through hole walls for multi-layers PCBs can be made conductive and then electroplated with copper to form the plated-through holes.

A conventional fabrication technique for making a multi-layer PCB is to start with a two-sided copper-clad laminate, etch the circuitry on both copper sides, then laminate to the top and bottom another layer of pre-preg and copper foil. Lamination is done by placing the stack of materials in a press and applying pressure and heat for a period of time. This results in a one piece product. Additional layers can be similarly added to the top and/or bottom. Once all the layers are added, the PCB is drilled to form through holes, plated to form plated through holes, and the top and bottom copper foils are etched to form conductive traces on the top and bottom layers of the PCB.

Advanced PCBs may contain components, such as capacitors, resistors or active devices, embedded in the PCB laminate. To embed such a component in the PCB, a cavity is formed in an already cured layer of C stage pre-preg. An adhesive is applied to a bottom surface of the component and the component is placed into the cavity with the bottom side adhesive contacting a bottom surface of the cavity. In most cases the cavity is formed through an entire thickness of the pre-preg so that the surface to which the component is adhered is an underlying copper layer onto which the pre-preg was laminated. Additional layers of the PCB are then added over the component and corresponding pre-preg layer. A problem with this approach is that the adhesive applied to the bottom surface of the component does not have the same thermal properties, such as the coefficient of thermal expansion (CTE), as the surface of the copper to which the component is adhered. As such, during subsequent lamination cycle for adding additional layers to the PCB, the component will move slightly compared to the rest of the PCB stack due to the CTE mismatch. This effects tolerances corresponding to interconnects coupled to contact pads on the top surface of the component. Additionally, the cavity needs to be formed with ample room to allow placement of the component within the cavity. As such, after placement of the component in the cavity there is a gap between the component and the cavity side walls. To secure the component in place, an additional step is performed of adding a filler material, such as A stage pre-preg, into the gap. In practice, the gap may not be completely filled due to voids or bubbles.

SUMMARY OF THE INVENTION

Embodiments of a PCB having an embedded component is directed to a PCB stack having an adhesive layer applied across an entire surface of a copper layer and an electronic component selectively on a portion of the adhesive layer. A B stage pre-preg layer having a component cut-out is added onto the adhesive layer such that the electronic component adhered to the adhesive layer fits within the component cut-out of the B stage pre-preg layer. Another copper layer is added onto the B stage pre-preg layer and the PCB stack is laminated. Since B stage pre-preg is not fully cured, a gap between the electronic component and a side wall of the component cut-out is filled by flow of the surrounding B stage pre-preg during the lamination step. One or more additional pre-preg and copper layers are added to the PCB stack with corresponding interconnects formed and coupled to the contact pads on the electronic component. Since the adhesive layer is applied across an entire cross-layer of the PCB stack, there is no relative movement of the adhered electronic component relative to the other layers in the stack, as all cross-sections in the stack include the adhesive layer.

In an aspect, a printed circuit board is disclosed. The printed circuit board includes a core substrate having a first copper layer, a first pre-preg layer and a second copper layer, an adhesive layer, an electronic component, a second pre-preg layer and a third copper layer. The first copper layer is laminated to a first surface of a first pre-preg layer and the second copper layer is laminated to a second surface of the pre-preg layer. The adhesive layer is applied to an entire first surface of the first copper layer. The electronic component has a first surface adhered to the adhesive layer. The second pre-preg layer is laminated to the first copper layer. The second pre-preg layer includes a component cut-out. The second pre-preg layer is coupled to the adhesive layer such that the electronic component fits within the component cut-out. The third copper layer is laminated to the second pre-preg layer. In some embodiments, the electronic component includes one or more contact pads on a second surface, and the third copper layer includes one or more patterned interconnects coupled to the one or more contact pads. In some embodiments, the printed circuit board also includes one or more additional pre-preg and copper layers laminated to the third copper layer. In some embodiments, the printed circuit board also includes one or more additional pre-preg and copper layers laminated to the second copper layer. In some embodiments, the electronic component is an active electronic component. In some embodiments, the electronic component is a passive electronic component.

In another aspect, another printed circuit board is disclosed. The printed circuit board includes a core substrate having a first copper layer, a first pre-preg layer and a second copper layer, an adhesive layer, an electronic component, a second pre-preg layer, a third pre-preg layer and a third copper layer. The a first copper layer is laminated to a first surface of a first pre-preg layer and the second copper layer is laminated to a second surface of the pre-preg layer. The adhesive layer is applied to an entire first surface of the first copper layer. The electronic component has a first surface adhered to the adhesive layer. The second pre-preg layer is laminated to the first copper layer. The second pre-preg layer includes a component cut-out, and the second pre-preg layer is aligned with the adhesive layer such that the electronic component fits within the component cut-out. The third pre-preg layer is laminated to the second pre-preg layer and is coupled to a second surface of the electronic component. The third copper layer is laminated to the third pre-preg layer. In some embodiments, the printed circuit board also includes one or more vias through the third pre-preg layer, wherein each through via is an interconnect between the third copper layer and the electronic component. In some embodiments, the electronic component includes one or more contact pads on the second surface, and the third copper layer includes one or more patterned interconnects, further wherein one via interconnects one patterned interconnect of the third copper layer to one contact pad of the electronic component. In some embodiments, the printed circuit board also includes one or more additional pre-preg and copper layers laminated to the third copper layer. In some embodiments, the printed circuit board also includes one or more additional pre-preg and copper layers laminated to the second copper layer. In some embodiments, the electronic component is an active electronic component. In some embodiments, the electronic component is a passive electronic component.

In yet another aspect, a method of fabricating a printed circuit board is disclosed. The method includes laminating a first copper layer to a first surface of a first pre-preg layer and a second copper layer to a second surface of the pre-preg layer to form a core substrate layer. The method also includes applying an adhesive layer to an entire first surface of the first copper layer, and adhering a first surface of an electronic component to the adhesive layer. The method also includes stacking a second pre-preg layer onto the first copper layer. The second pre-preg layer is a B stage pre-preg. The second pre-preg layer includes a component cut-out and the second pre-preg layer is stacked onto the adhesive layer such that the electronic component fits within the component cut-out. The method also includes stacking a third copper layer onto the second pre-preg layer, and laminating the adhesive layer, the second pre-preg layer and the third copper layer. In some embodiments, while laminating the adhesive layer, the second pre-preg layer and the third copper layer the second pre-preg layer flows into contact with the electronic component. In some embodiments, laminating the adhesive layer, the second pre-preg layer and the third copper layer fully cures the second pre-preg layer such that the second pre-preg layer becomes C stage pre-preg. In some embodiments, the third copper layer is formed into patterned interconnects, and the electronic component includes one or more contact pads on a second surface coupled to select one or more patterned interconnects. In some embodiments, the method also includes stacking and laminating one or more additional pre-preg and copper layers to the third copper layer. In some embodiments, the method also includes stacking and laminating one or more additional pre-preg and copper layers to the second copper layer.

In still yet another aspect, another method of fabricating a printed circuit board is disclosed. The method includes laminating a first copper layer to a first surface of a first pre-preg layer and a second copper layer to a second surface of the pre-preg layer to form a core substrate layer. The method also includes applying an adhesive layer to an entire first surface of the first copper layer, and adhering a first surface of an electronic component to the adhesive layer. The method also includes stacking a second pre-preg layer onto the first copper layer. The second pre-preg layer is a B stage pre-preg. The second pre-preg layer includes a component cut-out and the second pre-preg layer is stacked onto the adhesive layer such that the electronic component fits within the component cut-out. The method also includes stacking a third pre-preg layer onto the second pre-preg layer and to a second surface of the electronic component. The third pre-preg layer is a B stage pre-preg. The method also includes stacking a third copper layer onto the third pre-preg layer, and laminating the adhesive layer, the second pre-preg layer, the third pre-preg layer and the third copper layer. In some embodiments, while laminating the adhesive layer, the second pre-preg layer, the third pre-preg layer and the third copper layer the second pre-preg layer and the third pre-preg layer flow into contact with the electronic component. In some embodiments, the method also includes forming one or more vias through the third pre-preg layer, wherein each via is an interconnect between the third copper layer and the electronic component. In some embodiments, the third copper layer is formed into patterned interconnects, and the electronic component includes one or more contact pads on a second surface, and one via interconnects one patterned interconnect of the third copper layer to one contact pad of the electronic component. In some embodiments, laminating the adhesive layer, the second pre-preg layer, the third pre-preg layer and the third copper layer fully cures the second pre-preg layer and the third pre-preg layer such that the second pre-preg layer and the third pre-preg layer each become C stage pre-preg. In some embodiments, the method also includes stacking and laminating one or more additional pre-preg and copper layers to the third copper layer. In some embodiments, the method also includes stacking and laminating one or more additional pre-preg and copper layers to the second copper layer.

BRIEF DESCRIPTION OF THE DRAWINGS

Several example embodiments are described with reference to the drawings, wherein like components are provided with like reference numerals. The example embodiments are intended to illustrate, but not to limit, the invention. The drawings include the following figures.

DETAILED DESCRIPTION OF THE EMBODIMENTS

Embodiments of the present application are directed to a printed circuit board having an embedded component. Those of ordinary skill in the art will realize that the following detailed description of the printed circuit board having an embedded component is illustrative only and is not intended to be in any way limiting. Other embodiments of the printed circuit board having an embedded component will readily suggest themselves to such skilled persons having the benefit of this disclosure.

Reference will now be made in detail to implementations of the printed circuit board having an embedded component as illustrated in the accompanying drawings. The same reference indicators will be used throughout the drawings and the following detailed description to refer to the same or like parts. In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application and business related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Figure 1:
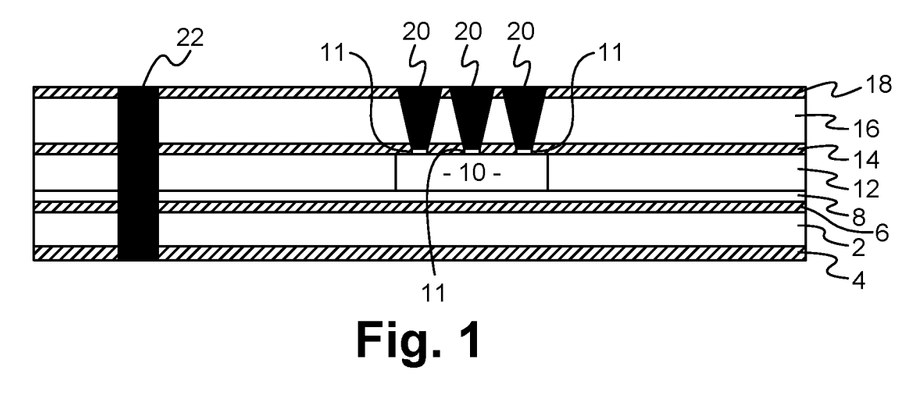
FIG. 1 illustrates a cut-out side view of a PCB having an embedded electronic component according to an embodiment.

FIG. 1 illustrates a cut-out side view of a PCB having an embedded electronic component according to an embodiment. The PCB includes a core substrate layer made of a pre-preg layer 2 between a copper layer 4 and a copper layer 6. Although shown as a single layer in FIG. 1, the copper layers are indicative of patterned interconnects. An adhesive layer 8 is coupled to the copper layer 6. The adhesive layer 8 is formed over the entire top surface of the copper layer 6. A pre-preg layer 12 is coupled to the adhesive layer 8. An electronic component 10 is positioned within a cut-out in the pre-preg layer 12 and is coupled to the adhesive layer 8. The electronic component 10 can be an active or passive electronic component. A copper layer 14 is coupled to the pre-preg layer 12. A pre-preg layer 16 is coupled to the copper layer 14. A copper layer 18 is coupled to the pre-preg layer 16. Micro vias 20 are formed to interconnect with contact pads 11 on the electronic component 10. One or more through hole vias 22 are formed through the entire PCB stack.

Figure 2:
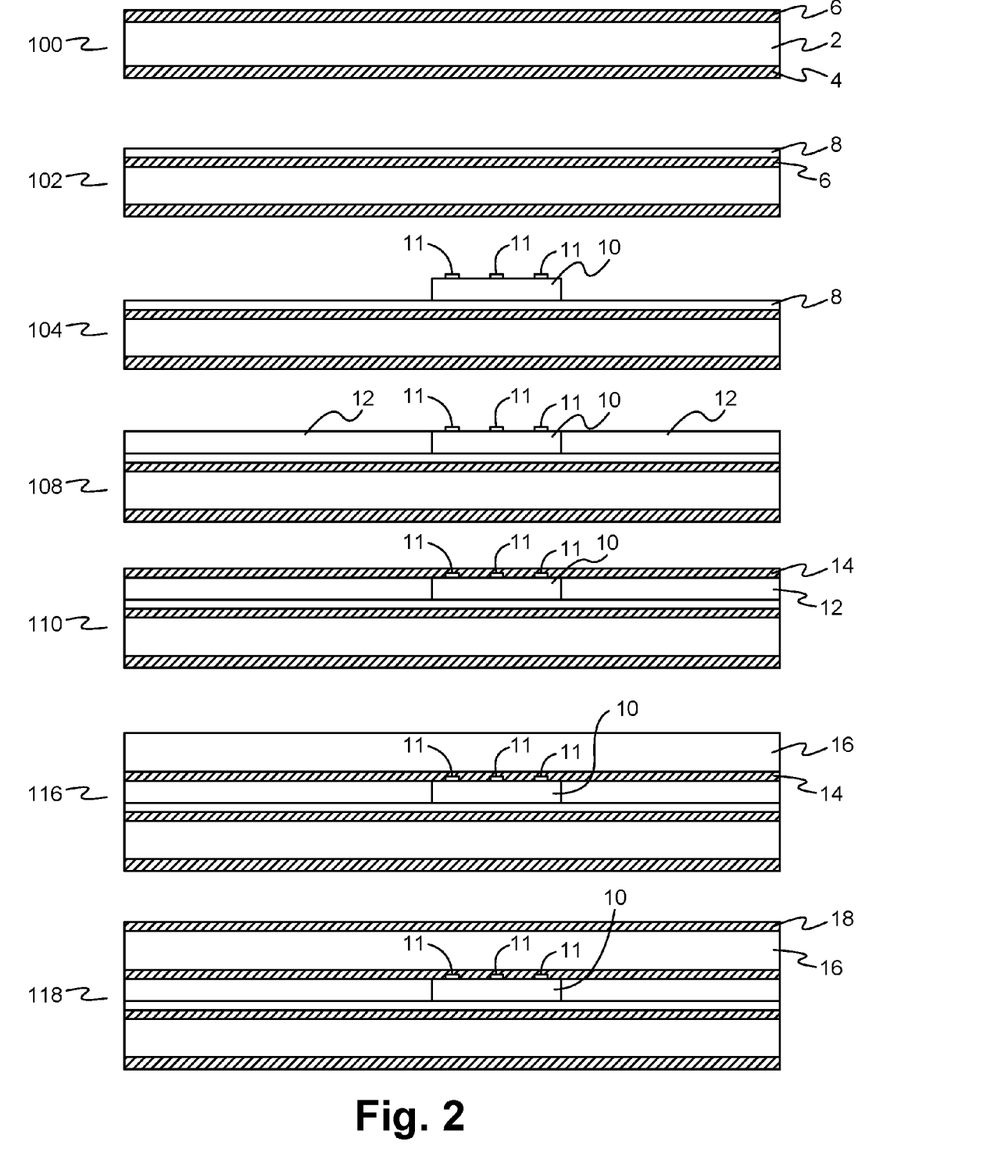
FIG. 2 illustrates a method of fabricating the PCB shown in FIG. 1 according to an embodiment.

FIG. 2 illustrates a method of fabricating the PCB shown in FIG. 1 according to an embodiment. At the step 100, the core substrate layer is formed. The core substrate layer is made by laminating a copper layer to one or both surfaces of pre-preg. As shown in FIG. 2, the copper layer 6 is coupled to a first surface of the pre-preg 2 and the copper layer 4 is coupled to a second surface of the pre-preg 2. The lamination process cures the pre-preg 2 so that the core substrate layer at the step 100 includes cured pre-preg. The copper layers 4 and 6 are then patterned and etched to form desired interconnects, contact pads and/or fiducials for subsequent component alignment.

At the step 102, the adhesive layer 8 is applied to the copper layer 6. The adhesive layer 8 covers the entire exposed top surface of the copper layer 6. In some embodiments, the adhesive layer 8 is an adhesive film. Exemplary techniques for applying the adhesive layer 8 include, but are not limited to, hot roll lamination, hot vacuum lamination or hot quick-lamination.

At the step 104, the electronic component 10 is positioned on the adhesive layer 8. In some embodiments, the core substrate layer with adhesive layer is placed on a carrier plate to provide support and a flat, smooth surface for electronic component placement with a pick and place machine. The fiducials on the copper layer 6 are used for accurate electronic component placement.

An optional step is performed of curing the core substrate layer and the adhesive layer 8 after placement of the electronic component 10. An automated optical inspection can be performed using the fiducials as a zero to measure accuracy of the electronic component placement. Rework may be performed at this point to properly position the electronic component. The inspection can be performed before or curing of the adhesive layer.

At the step 108, the pre-preg layer 12 is added. The pre-preg layer 12 is not fully cured, such as B stage pre-preg, at this step. Before adding the pre-preg layer 12 to the stack, the pre-preg layer 12 is prepared by cutting a hole, referred to as a component cut-out, in a pre-preg sheet. The component cut-out substantially matches the shape of the electronic component 10. The pre-preg sheet with component cut-out is aligned so that when placed on the adhesive layer 8 the electronic component 10 fits into the component cut-out in the pre-preg sheet. To avoid damaging the electronic component 10 when the pre-preg sheet is placed on the adhesive layer 8, the component cut-out is made slightly larger than the electronic component 10. As such, once the pre-preg sheet is added to the stack, there is a slight gap between the outer edge of the electronic component 10 and the edge of the component cut-out. The intent is to make this gap as small as possible while still allowing safe assembly of the pre-preg sheet with component cut-out onto the adhesive layer 8.

As is well known in the art, a variety of different types and sizes of pre-preg sheets are commercially available. Depending on the thickness of the pre-preg sheet selected and the thickness of the electronic component 10, one or more pre-preg sheets with corresponding component cut-outs may be used to form the pre-preg layer 12 having a desired thickness.

Figure 3:
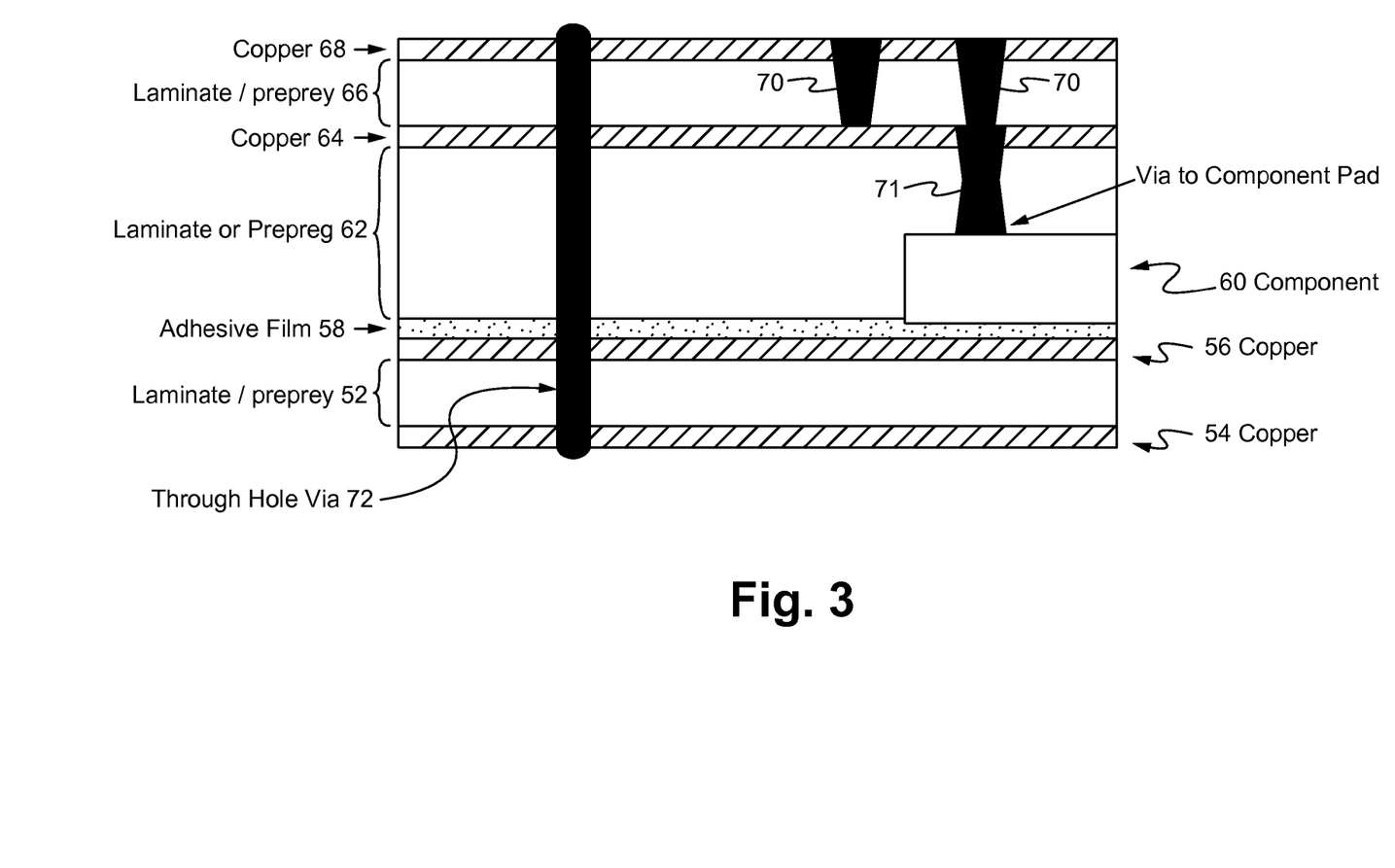
FIG. 3 illustrates a cut-out side view of a PCB having an embedded electronic component according to another embodiment.

In some embodiments, the thickness of the pre-preg layer 12 matches the thickness of the electronic component 10, as is shown in FIGS. 1 and 2. In other embodiments, an additional sheet of pre-preg without a component cut-out is placed over the pre-preg sheets with component cut-out to act as a "cap" over the component 10, as shown in FIG. 3.

At the step 110, the copper layer 14 is added onto the stack over the pre-preg layer 12 and the component 10.

A lamination step is performed, thereby laminating the copper layer 14 to the pre-preg layer 12 and curing the pre-preg layer 12. Since the pre-preg layer 12 was B stage pre-preg prior to this lamination step, during lamination the B stage pre-preg is pushed laterally into the gap as well as resin within the pre-preg flowing into the gap between the electronic component 10 and the component cut-out wall, thereby filling the gap with pre-preg. If the pre-preg had previously been fully cured, as in C stage pre-preg, resin would not flow in to the gap during the lamination step.

The copper layer 14 is patterned and etched to form desired interconnects and to provide access to the contact pads 11 on the surface of the component 10 facing the copper layer 14.

One or more additional pre-preg and copper layers can be laminated to the stack, onto either the copper layer 14 and/or the copper layer 4. Each additional copper layer is appropriately patterned and etched, and appropriate vias can be formed through the pre-preg layer. In the exemplary PCB stack of FIGS. 1 and 2, the pre-preg layer 16 is stacked onto the copper layer 14 at the step 116, and the copper layer 18 is stacked onto the pre-preg layer 16 at the step 118. A lamination step is performed, thereby laminating the copper layer 14, the pre-preg layer 16 and the copper layer 18. The lamination step also cures the pre-preg layer 16. At the step 122, the copper layer 18 is patterned and etched to form desired interconnects and micro vias 20 which are formed to provide interconnects between the copper layer 18 and the contact pads 11 on the component 10.

Once all layers of the stack are added, at the step 124 appropriate through hole vias 22 are formed through the PCB stack.

The PCB stack shown in FIGS. 1 and 2 show the pre-preg layer with component cut-out having the same or substantially the same thickness as the electronic component. Alternatively, the PCB stack can be configured such that an additional "cap" layer of pre-preg is added over the electronic component so as to further embed the electronic component in pre-preg.

FIG. 3 illustrates a cut-out side view of a PCB having an embedded electronic component according to another embodiment. The PCB in FIG. 3 is similar to the PCB of FIG. 1 with the addition of a pre-preg layer over the electronic component. The PCB in FIG. 3 includes a core substrate layer made of a pre-preg layer 52 between a copper layer 54 and a copper layer 56. Although shown as a single layer in FIG. 3, the copper layers are indicative of patterned interconnects. An adhesive layer 58 is coupled to the copper layer 56. The adhesive layer 58 is formed over the entire top surface of the copper layer 56. A pre-preg layer 62 is coupled to the adhesive layer 58. An electronic component 60 is positioned within a cut-out in the pre-preg layer 62 and is coupled to the adhesive layer 58. The electronic component 60 can be an active or passive electronic component. A copper layer 64 is coupled to the pre-preg layer 62. A pre-preg layer 66 is coupled to the copper layer 64. A copper layer 68 is coupled to the pre-preg layer 66. Micro vias 70 are formed to interconnect the copper layers 64 and 68, and micro vias 71 provide interconnections with contact pads on the electronic component 60. One or more through hole vias 72 are formed through the entire PCB stack.

Figure 4:
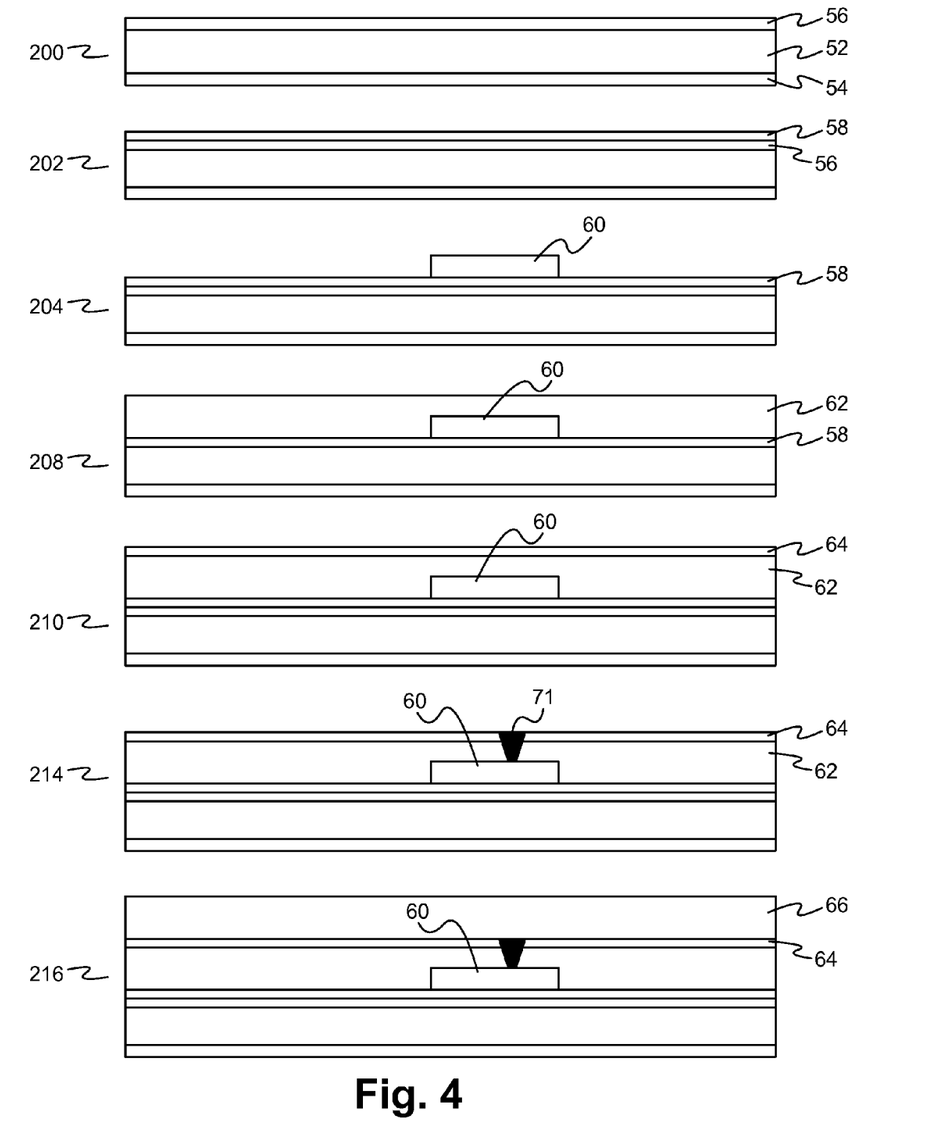
FIG. 4 illustrates a method of fabricating the PCB shown in FIG. 3 according to an embodiment.

FIG. 4 illustrates a method of fabricating the PCB shown in FIG. 3 according to an embodiment. At the step 200, the core substrate layer is formed. The core substrate layer is made by laminating a copper layer to one or both surfaces of pre-preg. As shown in FIG. 4, the copper layer 56 is coupled to a first surface of the pre-preg 52 and the copper layer 54 is coupled to a second surface of the pre-preg 52. The lamination process cures the pre-preg 52 so that the core substrate layer at the step 200 includes cured pre-preg. The copper layers 54 and 56 are then patterned and etched to form desired interconnects, contact pads and/or fiducials for subsequent component alignment.

At the step 202, the adhesive layer 58 is applied to the copper layer 56. The adhesive layer 58 covers the entire exposed top surface of the copper layer 56.

At the step 204, the electronic component 60 is positioned on the adhesive layer 58.

An optional step is performed of curing the core substrate layer and the adhesive layer 58 after placement of the electronic component 60.

At the step 208, the pre-preg layer 62 is added. The pre-preg layer 62 is not fully cured, such as B stage pre-preg, at this step. Before adding the pre-preg layer 62 to the stack, the pre-preg layer 22 is prepared by cutting a component cut-out in a pre-preg sheet. The pre-preg sheet with component cut-out is aligned so that when placed on the adhesive layer 58 the electronic component 60 fits into the component cut-out in the pre-preg sheet. Depending on the thickness of the pre-preg sheet selected and the thickness of the electronic component 60, one or more pre-preg sheets with corresponding component cut-outs may be used to form the pre-preg layer 62 having a desired thickness. An additional sheet of pre-preg without a component cut-out is placed over the pre-preg sheets with component cut-out to act as a "cap" over the component 60.

At the step 210, the copper layer 64 is added onto the stack over the pre-preg layer 62.

A lamination step is performed, thereby laminating the copper layer 64 to the pre-preg layer 62 and curing the pre-preg layer 62. Since the pre-preg layer 62 was B stage pre-preg prior to this lamination step, during lamination the resin in the B stage pre-preg flows into the gap between the electronic component 60 and the component cut-out wall, thereby filling the gap with pre-preg.

At the step 214, the copper layer 64 is patterned and etched to form desired interconnects and to provide access to the underlying pre-preg layer 62 that overlays the contact pads on the surface of the electronic component 60. The pre-preg layer 62 that overlays the contact pads is removed and filled with copper to form micro via 71. Micro via 71 provides an interconnect between a contact pad on the electronic component 60 and the copper layer 64. A micro via can be formed to interconnect each contact pad on the electronic component 60. In some embodiments, the micro via 71 is formed by drilling a hole through the "cap" portion of the pre-preg layer 62 to access the contact pad on the component 60. In some embodiments, a component-to-fiducial verification is performed. Using X-rays to locate the fiducials and contact pads on the electronic component, a numerical control program is created. The numerical control program is used for laser or mechanical drilling. Multiple programs may be created to insure highly accurate laser or mechanical drill location. The drilled holes can then be plated and/or filled with copper to form vias that interconnect with the contact pads of the electronic component.

One or more additional pre-preg and copper layers can be laminated to the stack, onto either the copper layer 64 and/or the copper layer 54. Each additional copper layer is appropriately patterned and etched, and appropriate vias can be formed through the pre-preg layer. In the exemplary PCB stack of FIGS. 3 and 4, the pre-preg layer 66 is stacked onto the copper layer 64 at the step 216, and the copper layer 68 is stacked onto the pre-preg layer 66 at the step 218. A lamination step is performed, thereby laminating the copper layer 64, the pre-preg layer 66 and the copper layer 68. The lamination step also cures the pre-preg layer 66. At the step 222, the copper layer 68 is patterned and etched to form desired interconnects and micro vias 70 are formed to provide interconnects between the copper layers 64 and 68.

Once all layers of the stack are added, at the step 224 appropriate through hole vias 72 are formed through the PCB stack.

The PCB stacks shown in FIGS. 1-4 include a single electronic component. It is understood that a PCB stack can be similarly fabricated to include more than one electronic component. For example, multiple electronic components can be embedded in the same pre-preg layer, or a single electronic component can be embedded in separate pre-preg layers, or some combination of one or more electronic components embedded in one or more separate pre-preg layers.

An advantage of this PCB and fabrication method is that using the adhesive layer across the entire surface improves the overall tolerance of the electronic component placement relative to subsequent copper layers and the resulting interconnects formed therefrom. This provides consistency in the mechanical coupling across the entire stack. This also enables the use of thicker, easier to use copper foils sheets as the copper layers. Conventional processes need to compensate for electronic component movement due to adhesive CTE mismatch and therefore use a much thinner copper sheet and build up the thickness to meet the necessary tolerances.

The present application has been described in terms of specific embodiments incorporating details to facilitate the understanding of the principles of construction and operation of the printed circuit board having an embedded component. Many of the components shown and described in the various figures can be interchanged to achieve the results necessary, and this description should be read to encompass such interchange as well. As such, references herein to specific embodiments and details thereof are not intended to limit the scope of the claims appended hereto. It will be apparent to those skilled in the art that modifications can be made to the embodiments chosen for illustration without departing from the spirit and scope of the application.

What is claimed is:

1. A printed circuit board comprising:
    a core substrate layer comprising a first copper layer laminated to a first surface of a first pre-preg layer and a second copper layer laminated to a second surface of the pre-preg layer;
    an adhesive layer of a same material applied to an entire first surface of the first copper layer;
    an electronic component having a first surface adhered to the adhesive layer;
    a second pre-preg layer laminated to the first copper layer, wherein the second pre-preg layer includes a component cut-out and the second pre-preg layer is coupled to the adhesive layer and configured such that the electronic component fits within the component cut-out and the second pre-preg layer contacts the electronic component due to flow of the second pre-preg layer during lamination;
    a third copper layer laminated to the second pre-preg layer.

2. The printed circuit board of claim 1 wherein the electronic component comprises one or more contact pads on a second surface.

3. The printed circuit board of claim 1 further comprising one or more additional pre-preg and copper layers laminated to the third copper layer.

4. The printed circuit board of claim 1 further comprising one or more additional pre-preg and copper layers laminated to the second copper layer.

5. The printed circuit board of claim 1 wherein the electronic component comprises an active electronic component.

6. The printed circuit board of claim 1 wherein the electronic component comprises a passive electronic component.

* * * * *